United States Patent
Chung et al.

(10) Patent No.: US 8,293,043 B2
(45) Date of Patent: Oct. 23, 2012

(54) AUTOMATIC LEVEL ADJUSTMENT FOR DIE BONDER

(75) Inventors: Kwok Kee Chung, Hong Kong (CN); Kui Kam Lam, Hong Kong (CN); Chi Keung Leung, Hong Kong (CN); Wai Yuen Cheung, Hong Kong (CN)

(73) Assignee: ASM Assembly Automation Ltd, Hong Kong (HK)

( * ) Notice: Subject to any disclaimer, the term of this patent is extended or adjusted under 35 U.S.C. 154(b) by 1380 days.

(21) Appl. No.: 11/459,503

(22) Filed: Jul. 24, 2006

(65) Prior Publication Data

US 2008/0017293 A1 Jan. 24, 2008

(51) Int. Cl.
*B32B 37/00* (2006.01)
(52) U.S. Cl. .......................................... 156/64; 156/378
(58) Field of Classification Search ....................... 156/64
See application file for complete search history.

(56) References Cited

U.S. PATENT DOCUMENTS

| | | | | |
|---|---|---|---|---|
| 4,772,835 A * | 9/1988 | Weaver et al. | ................ | 318/640 |
| 4,913,763 A * | 4/1990 | Yamazaki et al. | ............ | 156/358 |
| 5,246,513 A * | 9/1993 | Yoshida et al. | ................ | 156/64 |
| 6,474,538 B1 * | 11/2002 | Yonezawa et al. | ............ | 228/262 |
| 2004/0178327 A1* | 9/2004 | Widdowson et al. | ......... | 250/221 |
| 2007/0084901 A1* | 4/2007 | Gaunekar et al. | ............. | 228/4.5 |

FOREIGN PATENT DOCUMENTS

| JP | 03114240 A | * | 5/1991 |
|---|---|---|---|
| JP | 10084006 A | * | 3/1998 |

* cited by examiner

*Primary Examiner* — Philip Tucker
*Assistant Examiner* — Vicki Wu
(74) *Attorney, Agent, or Firm* — Ostrolenk Faber LLP

(57) ABSTRACT

A die bonding apparatus and method is provided to automatically adjust a level of a die bonder to compensate for any physical changes occurring in the die bonder during bonding. A bond arm support is drivable to a bonding level to position a die onto a bonding surface, and a bond arm is slidably mounted to the bond arm support for holding and bonding the die. The bond arm is configured to be urged by the bonding surface to move relative to the bond arm support upon contact of the die onto the bonding surface. A measuring device is provided for determining a distance moved by the bond arm relative to the bond arm support during bonding, and a controller is responsive to the distance determined by the measuring device to change the bonding level to which the bond arm support is driven.

14 Claims, 4 Drawing Sheets

AUTOMATIC LEVEL ADJUSTMENT FOR DIE BONDER

FIELD OF THE INVENTION

The invention relates to die bonding wherein a semiconductor die is attached to a bonding surface such as a substrate during assembly or packaging of an electronic device.

BACKGROUND AND PRIOR ART

Conventionally, semiconductor devices in the form of semiconductor dice or integrated circuits are housed into packages. A package serves various important functions such as protecting the device from mechanical and chemical damage. It is also a bridge that interconnects the device with a next level of packaging. Die attachment is one of the steps involved in the packaging process during which the die is placed on and attached to a die pad formed on the carrier or substrate. There are various methods for attaching the device onto the die pad, such as by using epoxy and adhesive resin as an adhesive to stick the device onto the pad or stamping flux on the pad and placing a die with solder on its back surface onto the flux before performing a solder reflow process.

An increasingly popular approach is to directly mount a die with a back surface of the die coated with solder onto a heated substrate. The solder melts when it comes into contact with the heated substrate, and a bond is formed to the substrate. This method is conventionally termed as eutectic die bonding, since the solder on the die is usually made from a composition of eutectic alloy.

Eutectic die bonding takes advantage of the lower melting point of eutectic alloys as compared to pure metals. The temperature of the substrate should be raised to above the melting point of the solder on the back surface of the die so that the solder melts immediately when the device is in contact with the die pad. When the substrate is subsequently cooled down, a metallurgical bond will form between the back surface of the die and the pad on the substrate. Some advantages of eutectic bonding over epoxy bonding include a higher service temperature capability for the die, good thermal/electrical conductivity between the die and the substrate and higher reliability.

FIG. 1 is a side view of a prior art die bonding apparatus 100 which is in a standby condition. The die bonding apparatus 100 generally comprises two main components, namely a bond arm support 102 and a bond arm 104. The bond arm 104 is linked to the bond arm support 102 via a sliding mechanism, so that the bond arm 104 is movable relative to the bond arm support 102. A collet 106 is mounted onto the bond arm 104 for holding dice, usually by utilizing vacuum suction, and bonding them onto bonding surfaces.

The bond arm support 102 is driven to undergo up-and-down z motion 108 to move the bond arm 104 and collet 106 towards or away from a bonding surface. The bond arm 104 is preferably preloaded to exert a downwards bonding pressure via the collet 106 onto a die positioned on a bonding surface, but is configured for upwards z motion 110 when the collet 106 is in contact with a relatively rigid surface that overcomes the preload force. The bond arm 104 will start to move upward 110 relative to the bond arm support 102 when the collet 106 contacts the rigid bonding surface and the bond arm support 102 is moved further towards the bonding surface.

The die bonding apparatus 100 also includes a contact sensor 112 that has separate components that are respectively mounted onto the bond arm support 102 and the bond arm 104. The separate components of the contact sensor 112 are touching at a standby position of the die bonding apparatus 100. Once the die held by the collet 106 contacts the rigid surface and the bond arm 104 undergoes upward movement 110 relative to the bond arm support 102, the components of the contact sensor 112 separate and contact is detected.

FIG. 2 is a side view of the prior art die bonding apparatus 100 of FIG. 1 when it is performing bonding. The collet 106 is holding a die 114 which is to be bonded onto a bonding surface 116. The bond arm support 102 lowers the bond arm 104 towards a pre-set bonding level and the die 114 lands on the bonding surface. Upon the die 114 contacting the rigid bonding surface, the components of the contact sensor 112 are separated and contact of the die with the bonding surface 116 is sensed. After the die 114 contacts the bonding surface 116, the bond arm support 102 will be moved slightly further towards the bonding surface 116 in order to utilize the preload in the bond arm 104 to apply a bond force onto the die 114. The die 114 is bonded onto the bonding surface 116 with such bond force. It should be appreciated that the separation distance of the components of the contact sensor 112 has been exaggerated in FIG. 2 for illustration purposes only.

Present die bonding apparatus 100 utilize open loop systems, which have no feedback control to enable bonding level adjustment during bonding. "Bonding level" refers to the level at which the bond arm support 102 is positioned during bonding so that a die 114 is made to contact the bonding surface 116 with a predetermined bonding force during bonding. The bonding level is only adjusted once when setting up the die bonding apparatus 100 for bonding. After the bonding level is decided and set, it will not be re-adjusted throughout the continuous running of the die bonding apparatus 100.

However, particularly for eutectic die bonding where heat is utilized to melt the solder on the die, there is usually a gradual change of the collet tip level with respect to the pre-set bonding level, due to factors such as the thermal expansion of the collet body or the wearing out of the collet tip. If the bonding level is kept constant, different collet tip levels lead to different approaching speeds of the collet 106 towards the bonding surface 116 of the substrate during continuous operation, and this causes different impact forces acting on the die 114, and the collet 106 itself, during bonding.

FIG. 3 is a graph showing a height of the bond arm support 102 over time as it moves to bond a die to a bonding surface 116. In the graph, the height of the bond arm support 102 relative to the bonding surface 116 decreases as the collet 106 is lowering a die 114 onto the bonding surface 116. A speed of approach of the bond arm support 102 decreases as the collet 106 nears the bonding surface 116, as represented by the decreasing slope of the graph. At contact point 118, the die 114 is in contact with the bonding surface 116. Z drive-in is then performed to further lower the bond arm support 102, say by another ΔD, in order to exert a bonding force onto the die 114.

For conventional die bonding apparatus 100, if the physical characteristics of the collet 106 change, such as if the body of the collet 106 expands, then the preset bonding level would no longer be optimal. For example, if the collet 106 expands by ΔL due to thermal expansion, according to FIG. 3, the die 114 would instead contact the bonding surface at contact point 120. At contact point 120, the approach speed of the bond arm support 102 is faster than at contact point 118. This implies that the impact force is greater when the die 114 contacts the bonding surface 116 and this increases the risk of damage to the collet 106 and/or die 114.

Furthermore, since the collet 106 has expanded by ΔL, the actual Z drive-in is increased to ΔD+ΔL, which exerts a greater bonding force than was intended when setting up the apparatus 100. This may adversely affect the bonding quality, and it is also difficult to anticipate the actual amount of deviation ΔL to compensate for this.

Thus, it is a shortcoming of such prior art die bonding apparatus that undesirable deviations in the impact forces may lead to collet and/or die damage, which might further lead to bonding stoppages due to clogging of the collet 106 or missing dice. These lead to reduced production throughput.

Large impact forces also lead to a shorter collet lifespan, which requires replacing collets more often during production. Again, this affects the production throughput, and increases the production cost. Moreover, uncontrolled variations of the effective position of the collet tip during continuous bonding causes issues such as varying and unpredictable bonding quality, wetting, weakened die shear strength, and even cracked dice.

SUMMARY OF THE INVENTION

Therefore, it is an object of the invention to seek to provide a method and apparatus for die bonding that can automatically carry out changes to the bonding level in response to changes in physical characteristics of the collet tip during its operation.

According to a first aspect of the invention, there is provided a die bonding apparatus comprising: a bond arm support that is drivable to a bonding level to position a die onto a bonding surface; a bond arm slidably mounted to the bond arm support for holding and bonding the die, and which is configured to be urged by the bonding surface to move relative to the bond arm support upon contact of the die onto the bonding surface; a measuring device for determining a distance moved by the bond arm relative to the bond arm support during bonding; and a controller responsive to the distance determined by the measuring device to change the bonding level to which the bond arm support is driven.

According to a second aspect of the invention, there is provided a method for bonding a die held by a bond arm onto a bonding surface, the bond arm being slidably mounted onto a bond arm support so that the bond arm is urged by the bonding surface to move relative to the bond arm support upon contact of the die onto the bonding surface, the method comprising the steps of: setting a bonding level to which the bond arm support is driven to position the die onto the bonding surface; bonding the die onto the bonding surface such that the bond arm moves relative to the bond arm support; determining an initial distance moved by the bond arm relative to the bond arm support during bonding; bonding another die in a subsequent bonding operation by driving the bond arm support to said bonding level such that the bond arm moves relative to the bond arm support; determining a current distance moved by the bond arm relative to the bond arm support during the subsequent bonding operation; and thereafter calculating the difference between the initial distance and the current distance moved by the bond arm and adjusting the bonding level according to said difference.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

An example of a die bonding apparatus in accordance with the invention will now be described with reference to the accompanying drawings, in which.

DETAILED DESCRIPTION OF THE PREFERRED EMBODIMENT

Figure 1:
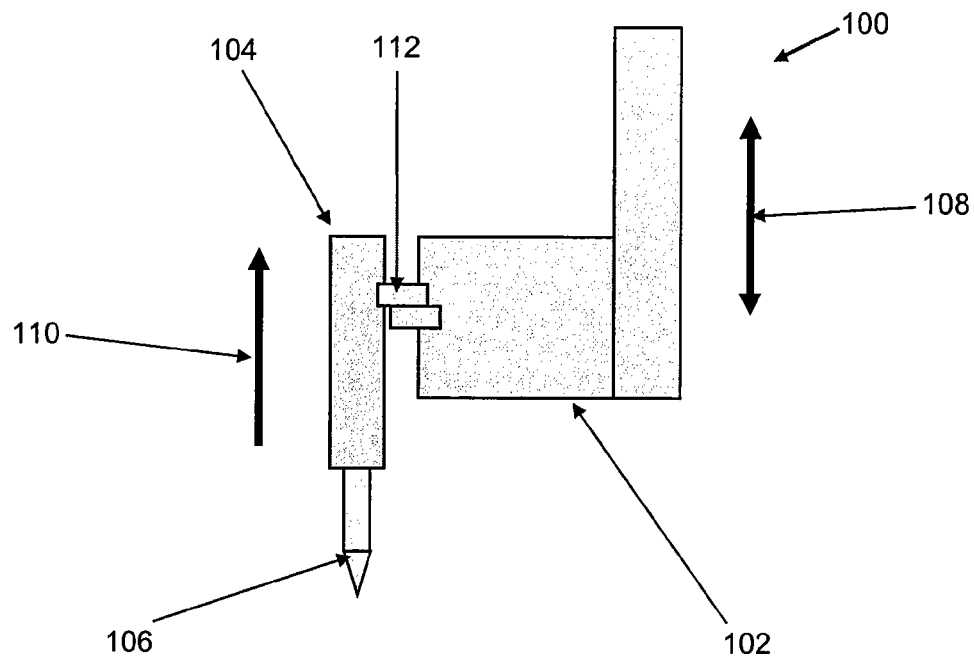
FIG. 1 is a side view of a prior art die bonding apparatus which is in a standby condition.
Figure 2:
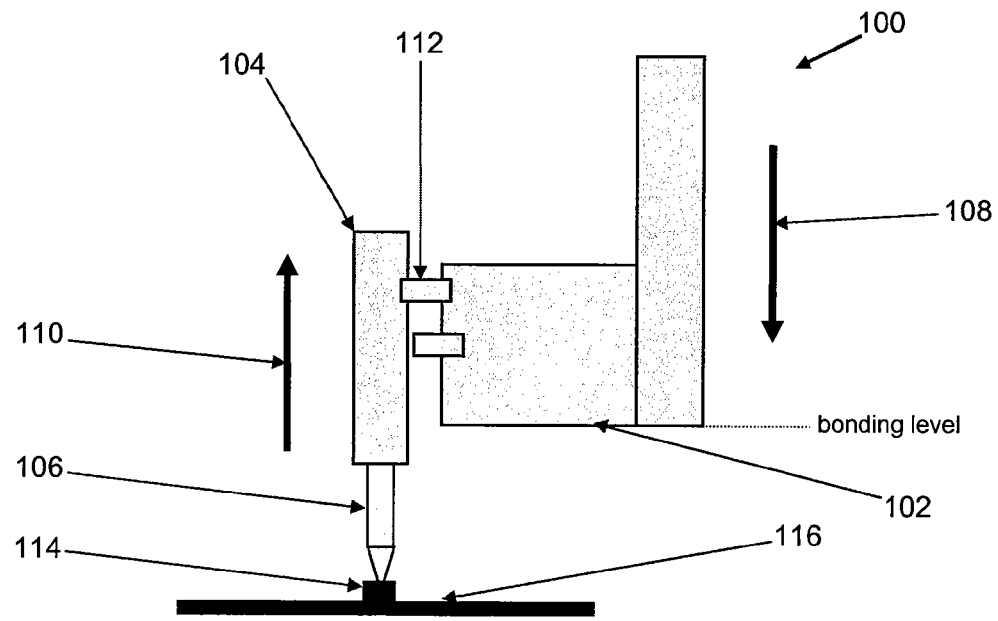
FIG. 2 is a side view of the prior art die bonding apparatus of FIG. 1 when it is performing bonding.
Figure 3:
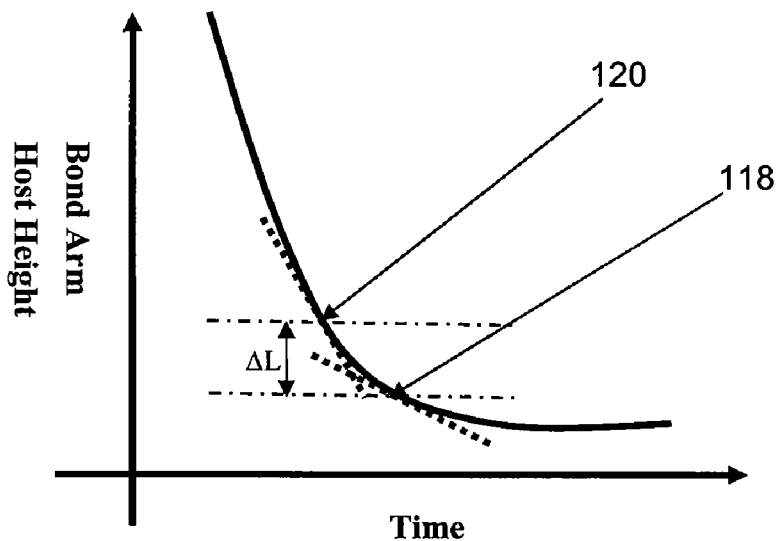
FIG. 3 is a graph showing a height of the bond arm support over time as it moves to bond a die to a bonding surface.
Figure 4:
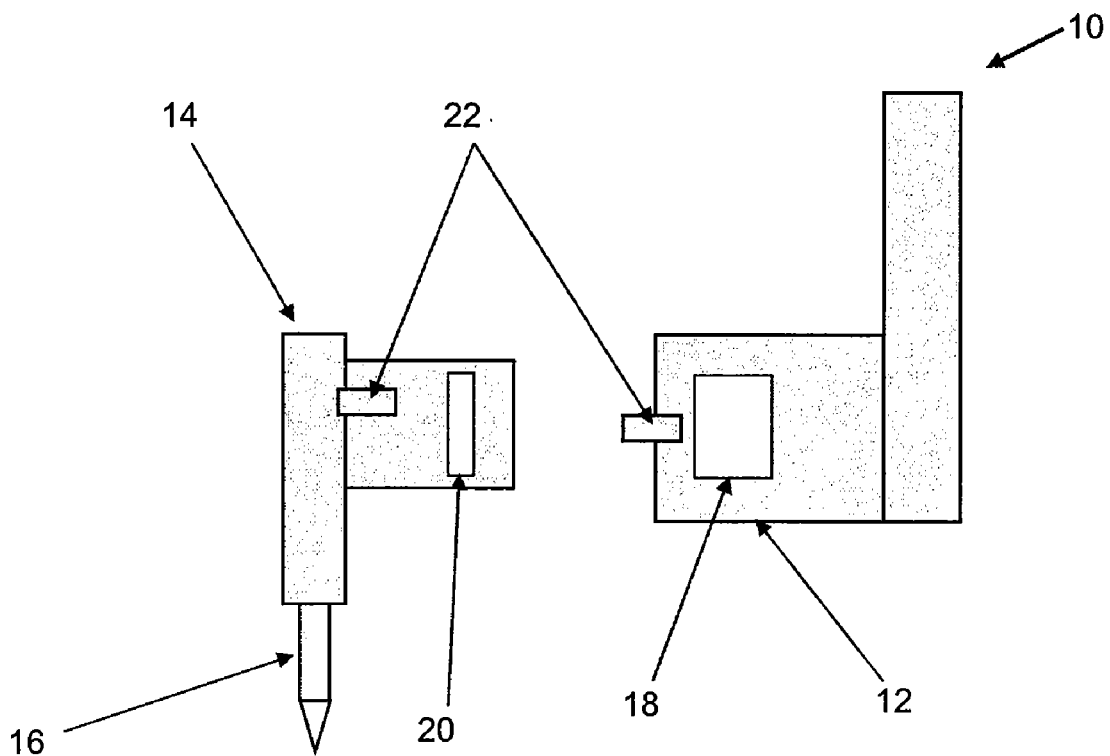
FIG. 4 is a side view of a die bonding apparatus according to the preferred embodiment of the invention wherein its bond arm is separated from its bond arm support.

FIG. 4 is a side view of a die bonding apparatus 10 according to the preferred embodiment of the invention wherein its bond arm 14 is separated from its bond arm support 12. A collet 16 is mounted onto the bond arm 14 for holding a die, preferably using vacuum suction. The bond arm 14 is configured to be slidable relative to the bond arm host 12 via a sliding mechanism. The bond arm support 12 is drivable to a bonding level to position a die onto a bonding surface. The bond arm 14 is configured to be urged by the bonding surface to move relative to the bond arm support 12 upon contact of the die onto the bonding surface.

The bond arm 14 preferably includes a preloading mechanism providing a preload force to bias the bond arm towards a reference position whereat the distance moved by the bond arm 14 relative to the bond arm support 12 is zero.

The preloading mechanism is also operative to exert a downwards bonding pressure via the bond arm 14 and the collet 16 onto a die positioned on a bonding surface.

The die bonding apparatus 10 also includes a measuring device such as an encoder, comprising an encoder reading head 18 and an optical grating scale 20. The measuring device is operative to determine a distance moved by the bond arm 14 relative to the bond arm support 12 during bonding. The encoder reading head 18 is mounted onto the bond arm support 12 and the optical grating scale 20 is mounted onto the bond arm 14, or vice versa. When the bond arm 14 moves relative to the bond arm support 12, the encoder reading head 18 will determine the distance moved by the bond arm 14 by referring to markings on the optical grating scale 20.

The die bonding apparatus 10 also includes a contact sensor 22, comprising two separate components, one mounted on the bond arm support 12 and the other mounted on the bond arm 14. It is operative to sense the instant at which a die held by the collet 16 has come into contact with a relatively rigid surface that overcomes the preload force in the bond arm 14.

Figure 5:
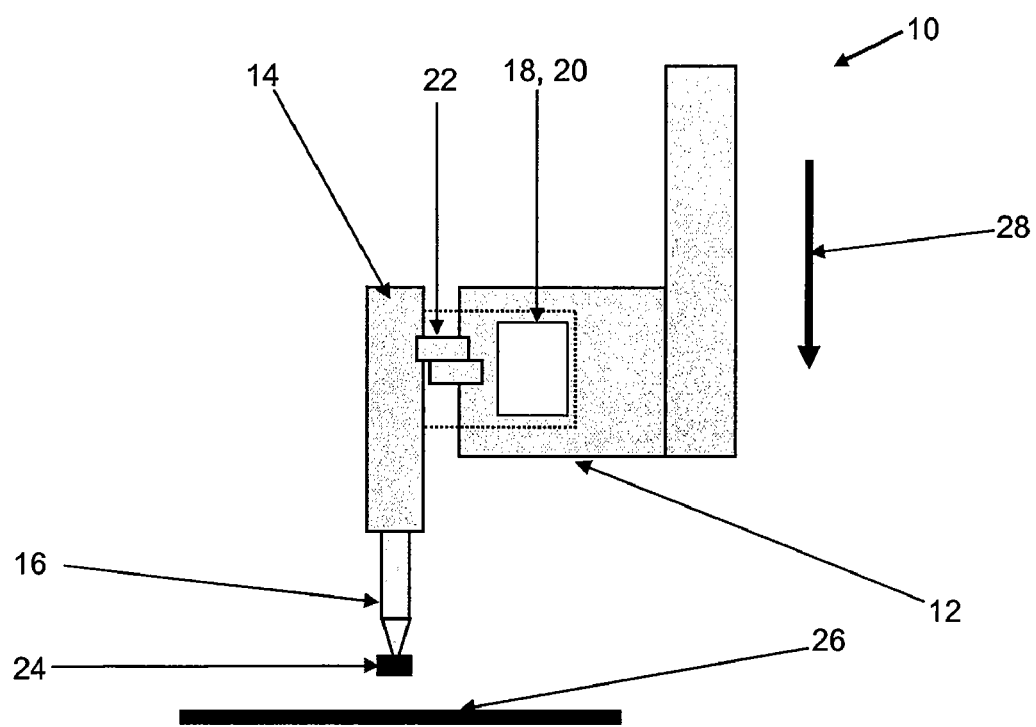
FIG. 5 is a side view of the die bonding apparatus of FIG. 4 as it holds a die and is preparing to bond the die onto a bonding surface.

FIG. 5 is a side view of the die bonding apparatus 10 of FIG. 4 as it holds a die 24 and is preparing to bond the die 24 onto a bonding surface 26. The bond arm 14 is mounted to the bond arm support 12 such that the encoder reading head 18 is able to read markings on the optical grating scale 20.

The separate components of the contact sensor 22 are in contact with each other and the bond arm 14 is preloaded with respect to the bond arm support 12 so that the components of the contact sensor 22 are kept in contact until they are separated by an external force. When setting the bonding level, the contact sensor 22 plays a role of recognizing the bonding level of the bond arm support 12 whereat the die 24 just touches the bonding surface 26. Then, the bonding level can be defined as this contact level plus an additional Z drive-in by which the bond host arm 12 is moved downwards by a further distance (such as ΔD) after contact with the bonding surface 26 has been made. In order to bond the die 24 to the bonding surface 26, the bond arm support 12 is lowered down to the pre-set bonding level.

Figure 6:
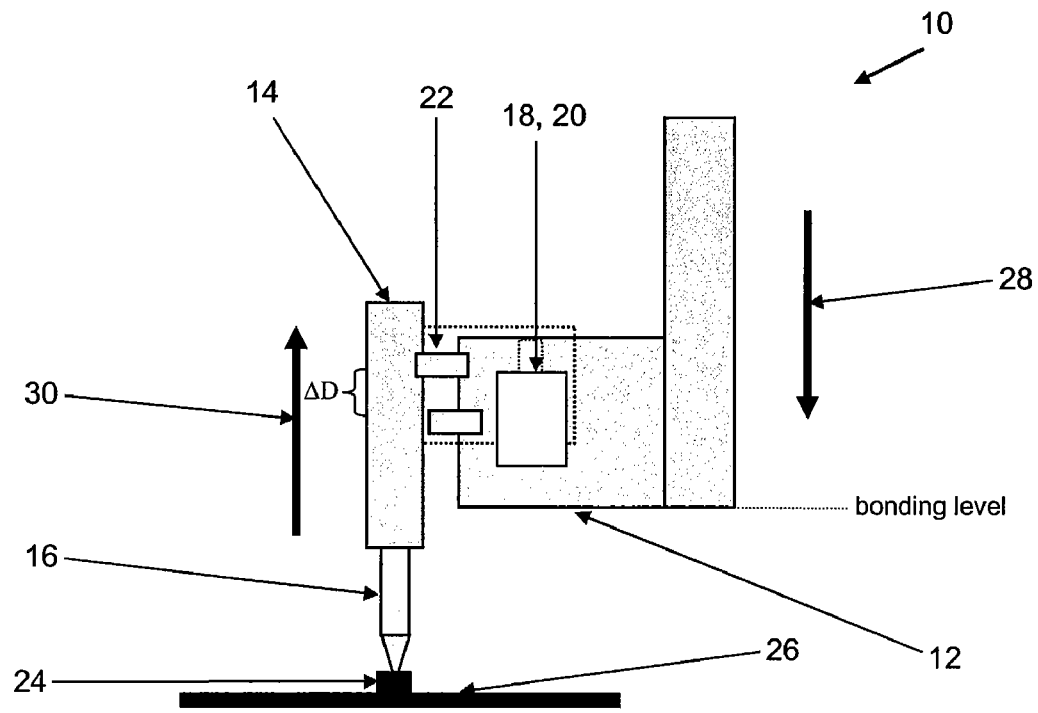
FIG. 6 is a side view of the die bonding apparatus of FIG. 5 when it is performing bonding.

FIG. 6 is a side view of the die bonding apparatus 10 of FIG. 5 when it is performing bonding. The die 24 is being pressed by the collet 16 against the bonding surface 26 and further downwards motion 28 of the bond arm support 12 causes upwards motion 30 of the bond arm 14 relative to the bond arm support 12. At the point at which the bond arm 14 moves relative to the bond arm support 12, the components of the contact sensor 22 separate and contact of the die 24 onto the bonding surface 26 is sensed.

When setting the bonding level of the die bonding apparatus 10 with a certain Z drive-in value during set-up, the position encoder records the corresponding marking on the optical grating scale 20 to determine the initial position encoder value at this position. During bonding operations, the most current position encoder value corresponding to the marking on the optical grating scale 20 is again determined and this is compared to the initial position encoder value. During every bonding cycle, the position encoder can also record the current position encoder value which is equivalent to the current Z drive-in value.

Once the position encoder detects a difference in the current Z drive-in value as compared to the initial position encoder value, a controller of the main control system will re-adjust the bonding level by setting the bonding level at a higher or lower level by the difference obtained, so as to maintain the current Z drive-in value to be the same as the pre-set distance (such as ΔD) for subsequent bonding operations.

Figure 7:
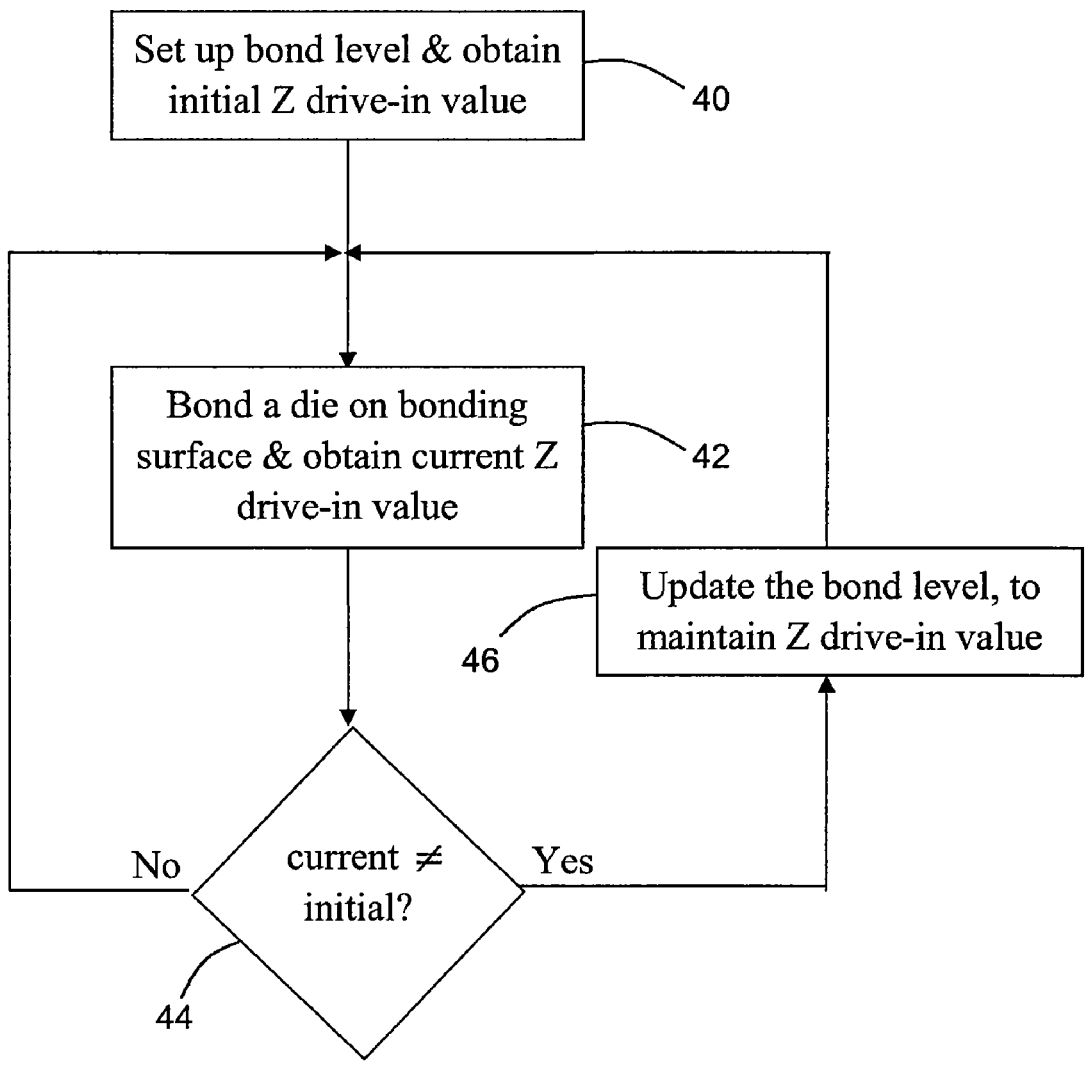
FIG. 7 shows an exemplary algorithm for changing a bonding level of the die bonding apparatus in real time according to the preferred embodiment of the invention during operation of the bonding apparatus.

The algorithm for automatic bonding level adjustment using the above apparatus is shown in FIG. 7. FIG. 7 shows an exemplary algorithm for changing a bonding level of the die bonding apparatus 10 in real time according to the preferred embodiment of the invention during operation of the bonding apparatus 10. The bonding level must first be set up before operation and an initial Z drive-in position encoder value at the said bonding level is determined 40. This is obtained from the position encoder by reading a marking on the optical grating scale 20 with the encoder reading head 18.

During operation, when a die 24 is bonded onto a bonding surface 26, the current Z drive-in position encoder value is obtained 42. A controller then determines the difference between the current position encoder value and the predetermined initial position encoder value 44, if any, such difference being indicative of physical changes to the collet 16 or other changes that might affect the position of the bond arm 14 relative to the bond arm support 12 at the pre-set bonding level. If the controller detects a difference between the current position encoder value and the initial position encoder value, the controller updates the bonding level by such difference 46. Thus, the actual Z drive-in distance is maintained at the required level, as explained above.

In an alternative embodiment, the encoder comprising the encoder reading head 18 and the optical grating scale 20 can be utilized to detect contact between the substrate 26 and die 24 when the bond arm 14 moves relative to the bond arm support 12. There will then be no necessity for a separate contact sensor 22. Instead, a simple stopper can be used to define a standby position of the bond arm 14, and any relative movement indicating contact can be detected by the encoder.

The algorithm mentioned above can also be applied to situations where the collet becomes shorter due to wearing out of the collet 16. When the collet 16 is worn out, the position encoder will detect a lower Z drive-in distance (in the above example, the actual Z drive-in is less than ΔD). Then the controller will update the bonding level by driving the bond arm support 12 lower by the detected difference, so to maintain the Z drive-in value for subsequent bonding operations.

Therefore, the die bonding apparatus according to the preferred embodiment of the invention utilizes a feedback control technique to avoid the problems identified in the prior art. The apparatus 10 automatically re-adjusts the pre-set bonding level by changing the bonding level for the bond arm support 12 for bonding the next die, so as to maintain the correct bonding Z drive-in condition for subsequent dice. It results in more accurate bonding and helps to avoid damage to the collet 16 as well as to the die 24.

It should be appreciated that less damage to the collet naturally improves the lifespan of the collet 16. This reduces production cost and increases production throughput. The apparatus 10 is also made more robust by controlling the bonding force for the die attach process, so that it is easier to maintain the bonding quality and avoid issues such as wetting, weakened die shear strength and cracked dice.

Moreover, since the bonding level is re-adjusted automatically during continuous bonding, there is no sacrifice of throughput because there is no need to stop bonding in order to re-adjust the bonding level. In particular, for epoxy bonding processes, the real time monitoring function of position encoder can further help to control Bond Line Thickness ("BLT"), especially any variations of the BLT. Real-time control also means that there are fewer demands on the mechanical material of the bond arm module and collet body to reduce the possibility and extent of thermal expansion.

The invention described herein is susceptible to variations, modifications and/or addition other than those specifically described and it is to be understood that the invention includes all such variations, modifications and/or additions which fall within the spirit and scope of the above description.

The invention claimed is:

1. Die bonding apparatus comprising:
   a bond arm support drivable in a linear bonding direction to a bonding level to bond a die onto a bonding surface;
   a bond arm which is slidably mounted to the bond arm support for holding and bonding the die, the bond arm being configured to be urged by the bonding surface to slide relative to the bond arm support by a drive-in distance in a linear direction opposite to the linear bonding direction upon contact of the die onto the bonding surface;
   a measuring device configured to measure the drive-in distance moved by the bond arm relative to the bond arm support when the bond arm support has been driven to the bonding level; and
   a controller configured to respond to the drive-in distance measured by the measuring device to determine anew a bonding level to which the bond arm support is driven during bonding of at least one subsequent die, the bond arm support being driven to the new bonding level when bonding the at least one subsequent die,
   wherein an initial bonding level is set based upon an initial drive-in distance, the initial drive-in distance being a distance moved by the bond arm relative to the bond arm support in the linear direction opposite to the linear bonding direction when the bond arm support has been driven to the bonding level.

2. Die bonding apparatus as claimed in claim 1, wherein the measuring device comprises an encoder.

3. Die bonding apparatus as claimed in claim 2, wherein the encoder comprises an encoder reading head mounted onto the bond arm and comprises an optical grating scale mounted onto the bond arm support.

4. Die bonding apparatus as claimed in claim 1, further comprising a contact sensor mounted to the bond arm for determining an instant at which the die contacts the bonding surface.

5. Die bonding apparatus as claimed in claim 1, including a preloading mechanism operable to bias the bond arm towards a reference position whereat the distance moved by the bond arm relative to the bond arm support is zero.

6. Method for bonding a die held by a bond arm onto a bonding surface, the bond arm being slidably mounted onto a bond arm support so that the bond arm is urged by the bonding surface to slide relative to the bond arm support upon contact of the die onto the bonding surface, the method comprising the steps of:
   a. setting an initial bonding level based upon a measured initial distance moved by the bond arm relative to the bond arm support in a linear direction opposite to a linear bonding direction when the bond arm support has been driven to the bonding level;
   b. driving the bond arm support in the linear bonding direction to the bonding level to bond a die onto the bonding surface;
   c. bonding the die onto the bonding surface at the bonding level such that the bond arm slides relative to the bond arm support in the linear direction opposite to the linear bonding direction;
   d. determining a measured current distance moved by the bond arm relative to the bond arm support when the bond arm support has been driven to the bonding level;
   e. calculating a difference between the measured initial distance and the measured current distance moved by the bond arm and adjusting the bonding level anew to a bonding level according to said difference; and
   f. returning to step b.

7. Method as claimed in claim 6, further comprising the step of detecting contact by the die onto the bonding surface by detecting movement of the bond arm relative to the bond arm support.

8. Method as claimed in claim 6, further comprising the step of detecting contact by the die onto the bonding surface with a contact sensor mounted to sense relative movement between the bond arm and the bond arm support.

9. Method as claimed in claim 6, including the step of generating a preload on the bond arm to bias the bond arm towards a reference position whereat the distance moved by the bond arm with respect to the bond arm support is zero.

10. The die bonding apparatus of claim 1, wherein the controller is configured to determine a new bonding level to which the bond arm support is to be driven when bonding each subsequent die, and the bond arm support is driven to the new bonding level to position each subsequent die onto the bonding surface.

11. Die bonding apparatus as claimed in claim 1, wherein the bond arm support is driven a distance in the linear bonding direction to the bonding level, the distance not being predetermined.

12. Die bonding apparatus as claimed in claim 1, wherein the measuring device includes a marked scale for measuring the distance moved by the bond arm relative to the bond arm support.

13. Method as claimed in claim 6, wherein if the measured current distance is greater than the measured initial distance, then the bonding level is raised by a distance equal to a difference obtained by subtracting the measured initial distance from the measured current distance, and if the measured current distance is less than the measured initial distance, then the bonding level is lowered by a distance equal to a difference obtained by subtracting the measured current distance from the measured initial distance.

14. Die bonding apparatus comprising:
   a bond arm support drivable in a linear bonding direction to a bonding level to bond a die onto a bonding surface;
   a bond arm which is slidably mounted to the bond arm support for holding and bonding the die, the bond arm being configured to be urged by the bonding surface to slide relative to the bond arm support by a drive-in distance in a linear direction opposite to the linear bonding direction upon contact of the die onto the bonding surface;
   a measuring device configured to measure the drive-in distance moved by the bond arm relative to the bond arm support when the bond arm support has been driven to the bonding level; and
   a controller configured to respond to the drive-in distance measured by the measuring device to determine anew a bonding level to which the bond arm support is driven during bonding of at least one subsequent die, the bond arm support being driven to the new bonding level when bonding the at least one subsequent die, the bonding level being determined anew so that the new bonding level, at which the die is in contact with the bonding surface and is bonded with the bonding surface at the new bonding level, is such that the drive-in distance moved by the bond arm relative to the bond arm support when the bond arm support has been driven to the bonding level is equal to an initial drive-in distance,
   wherein an initial bonding level is set based upon the initial drive-in distance, the initial drive-in distance being a distance moved by the bond arm relative to the bond arm support in the linear direction opposite to the linear bonding direction when the bond arm support has been driven to the bonding level.

* * * * *